(12) United States Patent
Rhe et al.

(10) Patent No.: US 11,237,592 B2
(45) Date of Patent: Feb. 1, 2022

(54) DISPLAY DEVICE

(71) Applicant: LG DISPLAY CO., LTD., Seoul (KR)

(72) Inventors: Ruda Rhe, Seoul (KR); SuChang An, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/944,721

(22) Filed: Jul. 31, 2020

(65) Prior Publication Data

US 2020/0363899 A1 Nov. 19, 2020

Related U.S. Application Data

(63) Continuation of application No. 16/169,927, filed on Oct. 24, 2018, now Pat. No. 10,768,742.

(30) Foreign Application Priority Data

Oct. 27, 2017 (KR) .................... 10-2017-0141558

(51) Int. Cl.
| | |
|---|---|
| *G06F 1/16* | (2006.01) |
| *G06F 3/041* | (2006.01) |
| *H01L 51/00* | (2006.01) |
| *H01L 27/32* | (2006.01) |
| *G06F 3/044* | (2006.01) |

(52) U.S. Cl.
CPC .......... *G06F 1/1626* (2013.01); *G06F 1/1637* (2013.01); *G06F 3/044* (2013.01); *G06F 3/0412* (2013.01); *G06F 3/0416* (2013.01); *G06F 3/0443* (2019.05); *G06F 3/0446* (2019.05); *G06F 3/04164* (2019.05); *H01L 27/3276* (2013.01); *H01L 51/0097* (2013.01); *G06F 2203/04112* (2013.01); *H01L 27/323* (2013.01); *H01L 2251/5338* (2013.01)

(58) Field of Classification Search
CPC .... G06F 3/0416; G06F 3/0446; G06F 3/0412; G06F 3/044; G06F 3/04164; G06F 1/1626; G06F 1/1637; H01L 27/3276; H01L 27/323; H01L 51/0097; H01L 2251/5338
See application file for complete search history.

(56) References Cited

U.S. PATENT DOCUMENTS

| | | | |
|---|---|---|---|
| 9,276,055 B1 * | 3/2016 | Son | H01L 27/323 |
| 9,356,087 B1 | 5/2016 | Lee et al. | |
| 2014/0055702 A1 | 2/2014 | Park et al. | |
| 2014/0204285 A1 | 7/2014 | Jang | |
| 2017/0237025 A1 | 8/2017 | Choi et al. | |
| 2017/0277288 A1 | 9/2017 | Choi et al. | |

(Continued)

FOREIGN PATENT DOCUMENTS

| | | |
|---|---|---|
| CN | 106293197 A | 1/2017 |
| CN | 106959783 A | 7/2017 |

(Continued)

*Primary Examiner* — Kenneth B Lee, Jr.
(74) *Attorney, Agent, or Firm* — Seed IP Law Group LLP

(57) ABSTRACT

Embodiments of the present disclosure relate to a display device, and more particularly, to a display device in which the number of data link lines or touch lines can be increased in a bent area or a folded area of a display panel. According to the embodiments of the present disclosure, it is possible to provide a display device in which the number of data link lines or touch lines can be increased in a bent area or a folded area of a display panel.

18 Claims, 22 Drawing Sheets

(56) References Cited

U.S. PATENT DOCUMENTS

2017/0278918 A1 9/2017 Jeon
2018/0033830 A1 2/2018 Kim et al.

FOREIGN PATENT DOCUMENTS

| CN | 107086236 A | 8/2017 |
|----|-------------|--------|
| CN | 107230680 A | 10/2017 |
| EP | 3 109 742 A1 | 12/2016 |
| EP | 3 217 265 A1 | 9/2017 |

\* cited by examiner

DISPLAY DEVICE

CROSS REFERENCE TO RELATED APPLICATION

This application is a continuation of U.S. application Ser. No. 16/169,927, filed Oct. 24, 2018, which claims priority from Korean Patent Application No. 10-2017-0141558, filed on Oct. 27, 2017, which applications are hereby incorporated by reference for all purposes as if fully set forth herein.

BACKGROUND

Technical Field

Embodiments of the present disclosure relate to a display device.

Description of the Related Art

As a society develops into an information society, demand for display devices for displaying images is increasing in various forms. In recent years, various display devices such as a liquid crystal display device, a plasma display device, and an organic light-emitting diode display device have been utilized.

Such display devices include a display device capable of providing a touch-based input system that enables a user to easily input information or a command intuitively and conveniently, avoiding conventional input systems, such as a button, a keyboard, and a mouse.

In order for a display device to provide such a touch-based input system, it is necessary to determine presence or absence of a user's touch, and to correctly detect touch coordinates.

To this end, a capacitance-based touch sensing system for detecting the presence or absence of a touch, touch coordinates, or the like based on a change in capacitance formed on a plurality of touch electrodes is widely used among various types of touch sensing systems.

A conventional display device has a non-display area of a display panel in which a data line extends or a data link line and a touch line connected to the data line are disposed.

In order to provide a high-resolution image, the number of pixels per inch (PPI) of the display panel should be increased. In this case, the number of data lines should be increased, and when the display panel is a touch display panel, the number of touch lines connected to touch electrodes corresponding to pixels should also be increased.

However, since the non-display area of the display panel in which the data link lines and the touch lines can be disposed is limited in space, there is a limitation in increasing the number of lines in the non-display area in order to realize a high resolution.

Particularly, in the case of a partially bendable or foldable display panel, it has been difficult to implement a high resolution by increasing the number of lines while preventing the data link lines or the touch lines from being cracked in a bendable area or a foldable area of the display panel.

BRIEF SUMMARY

In view of the foregoing, an aspect of embodiments of the present disclosure is to provide a display device that is capable of increasing the number of data link lines or touch lines in a bendable area or a foldable area of a display panel.

Another aspect of embodiments of the present disclosure is to provide a display device that is capable of preventing a data link line or a touch line from being cracked in a bendable area or a foldable area of a display panel.

In addition, aspects of embodiments of the present disclosure are not limited those described above, and other aspects not mentioned above can be clearly understood by a person ordinarily skilled in the art from the following description.

In order to achieve the above-described aspect, embodiments of the present disclosure provide a display device in which data link lines or touch lines are alternately arranged in different layers in a bendable area or a foldable area of a display panel.

Embodiments of the present disclosure provide a display device including a metal data link line that constitutes a touch line of a display panel.

In addition, embodiments of the present disclosure provide a display device to which a structure for preventing a data link line or a touch line from being cracked in a bendable area or a foldable area of a display panel is applied.

As described above, according to the embodiments of the present disclosure, it is possible to provide a display device, in which the number of data link lines or touch lines can be increased in a bendable area or a foldable area of a display panel.

According to the embodiments of the present disclosure, it is possible to provide a display device, in which data link lines or touch lines can be prevented from being cracked in a bendable area or a foldable area of a display panel.

Further, according to the embodiments of the present disclosure, it is possible to provide a display device, in which the intervals of data link lines or touch lines can be reduced while maintaining the number of the data link lines or touch lines in a bendable area or a foldable area of a display panel, thereby implementing a narrow bezel.

BRIEF DESCRIPTION OF THE SEVERAL VIEWS OF THE DRAWINGS

The above and other aspects, features and advantages of the present disclosure will be more apparent from the following detailed description taken in conjunction with the accompanying drawings, in which.

DETAILED DESCRIPTION

Figure 1:
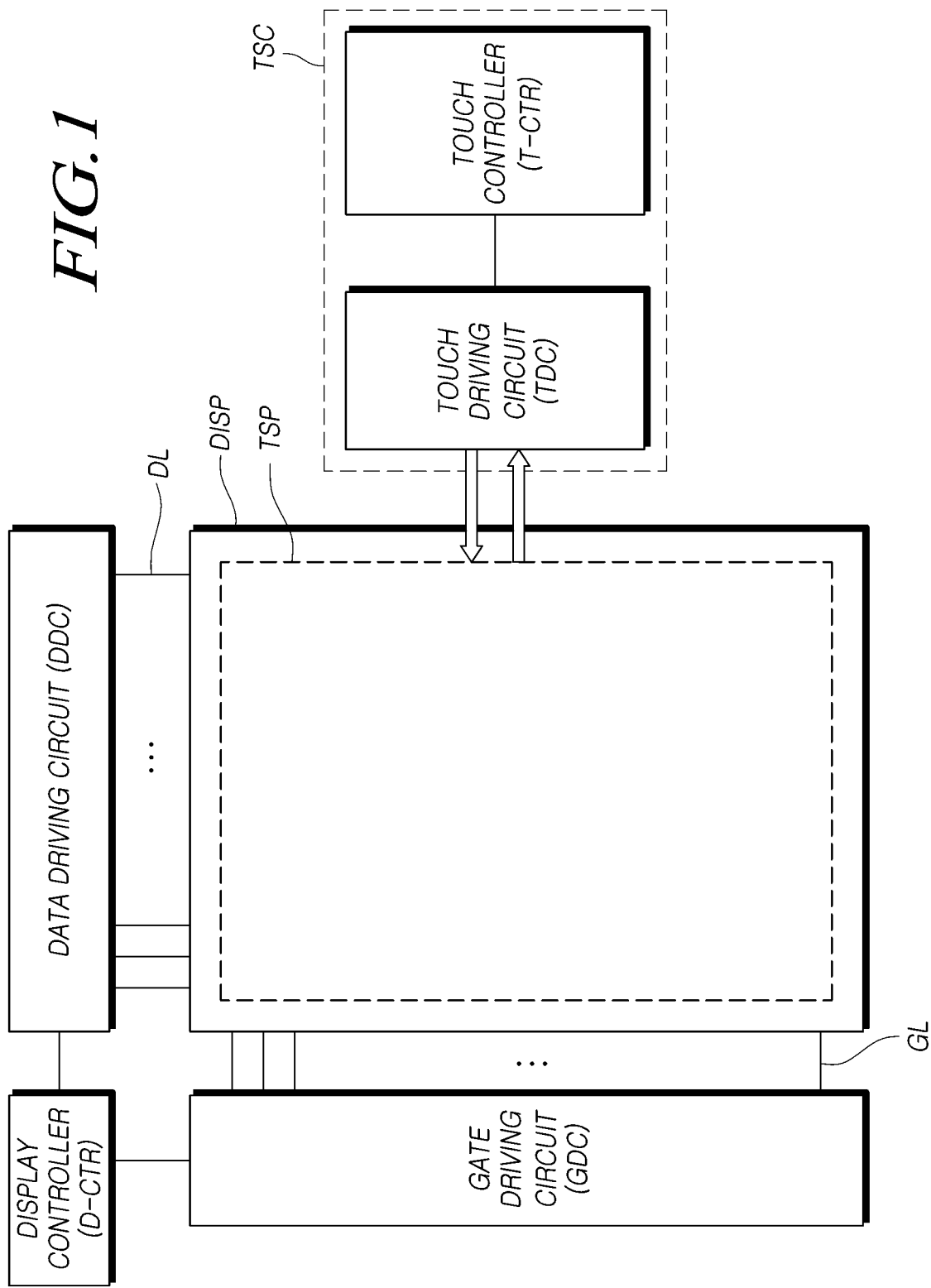
FIG. 1 is a system configuration diagram of a display device according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 2:
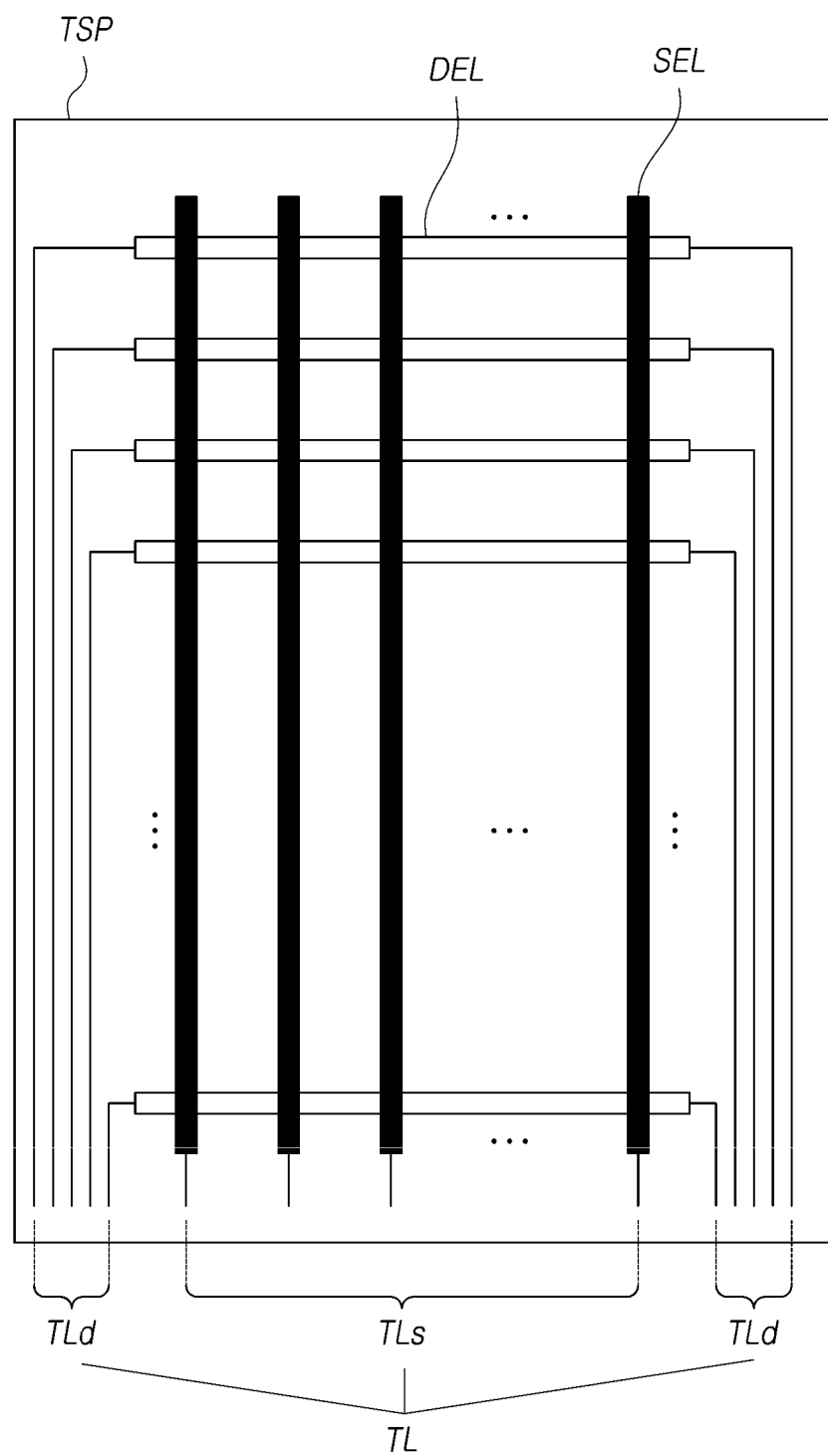
FIG. 2 is a diagram schematically illustrating a touch sensor structure within a touch area of the display panel according to the embodiments of the present disclosure.
Figure 3:
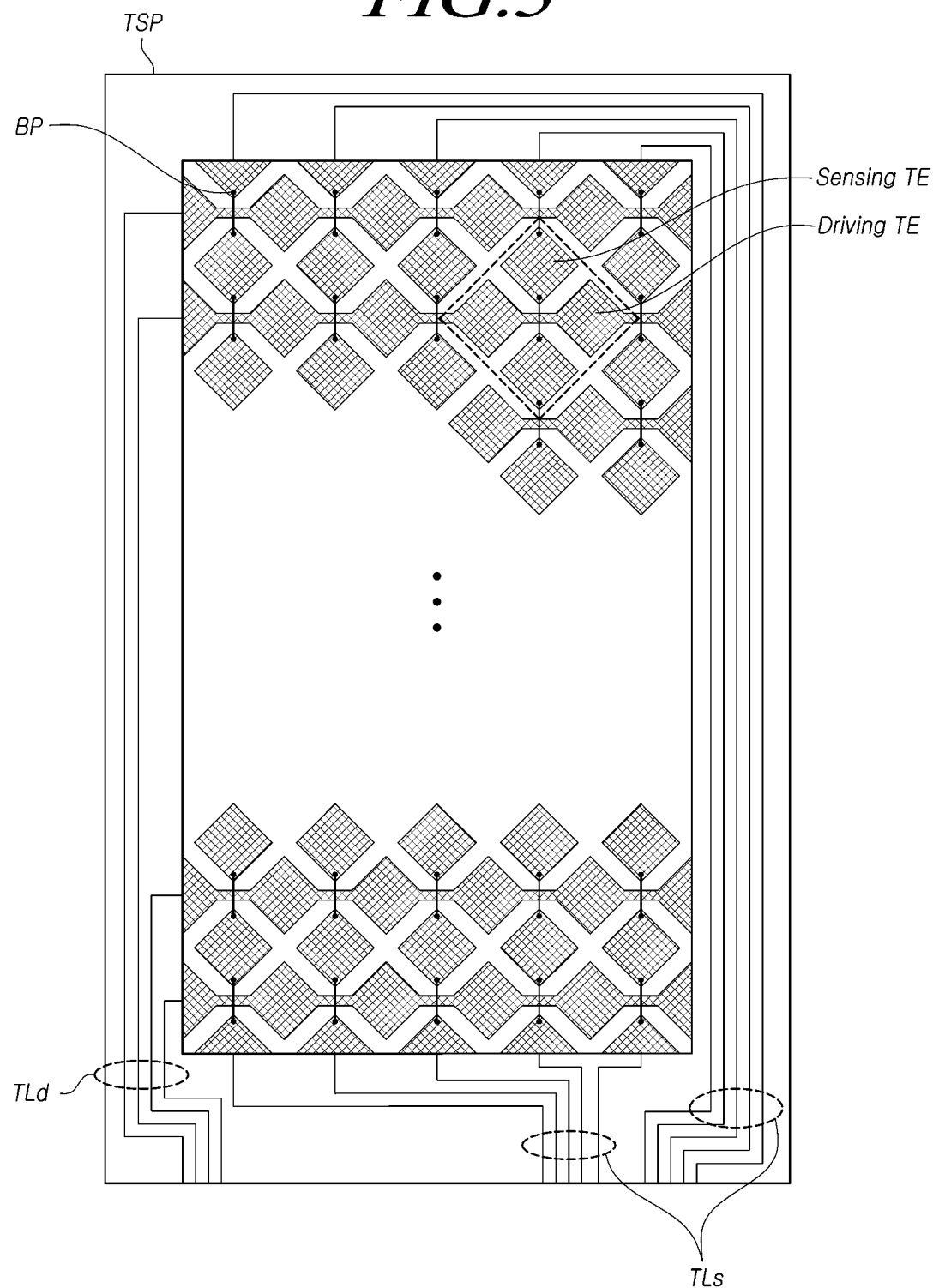
FIG. 3 is an exemplary diagram illustrating a touch sensor structure within a touch area of the display panel according to the embodiments of the present disclosure.
Figure 4:
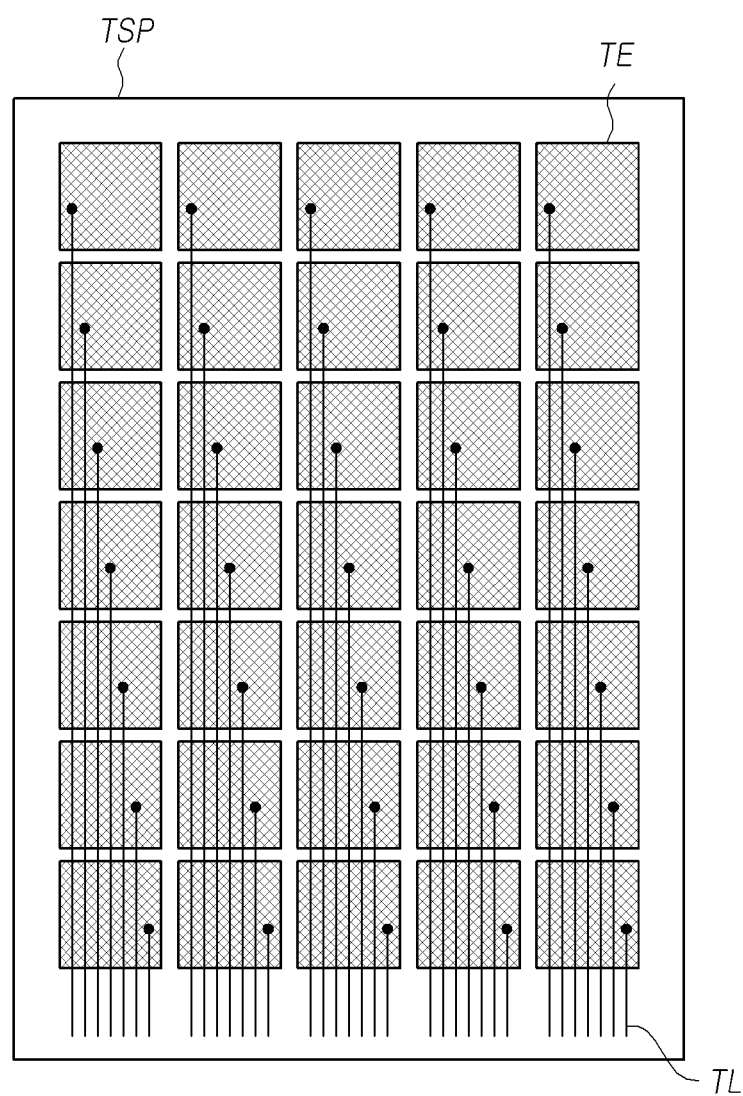
FIG. 4 is another exemplary diagram of a touch panel in the display device according to the embodiments of the present disclosure.
Figure 5:
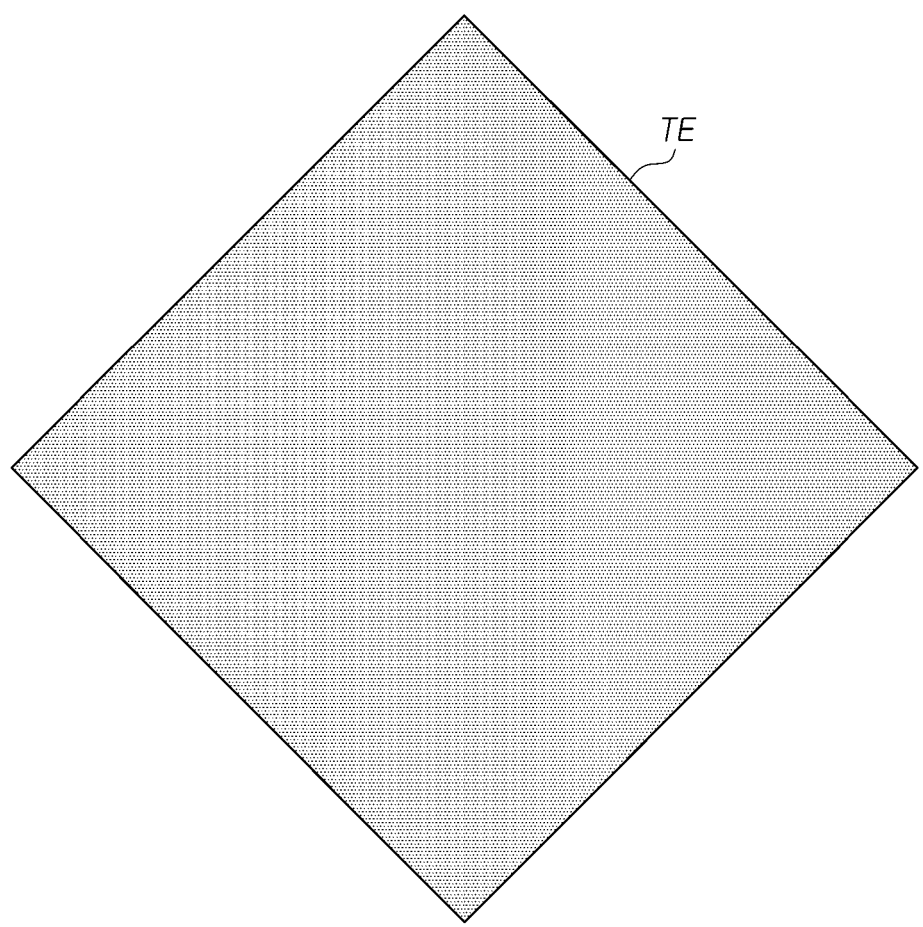
FIG. 5 is a diagram illustrating a non-mesh-type touch electrode in the display panel according to the embodiments of the present disclosure.
Figure 6:
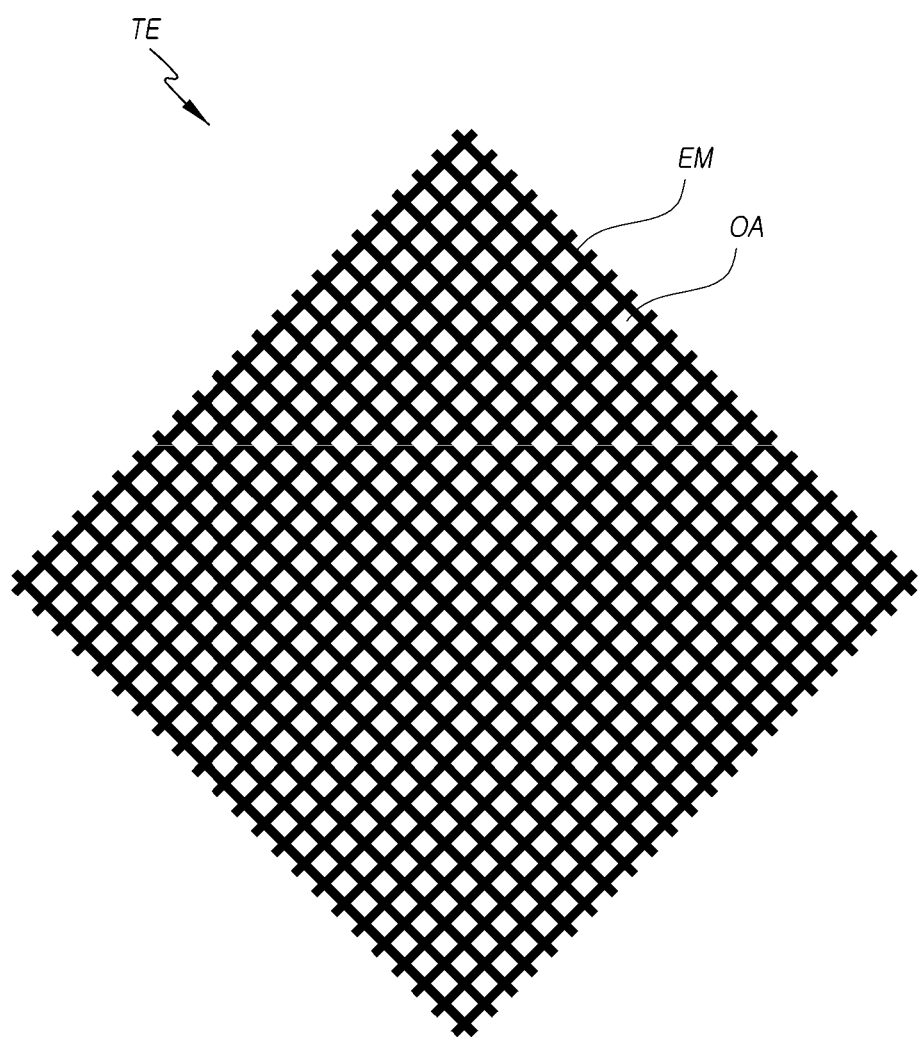
FIG. 6 is a diagram illustrating a mesh-type touch electrode in the touch panel according to the embodiments of the present disclosure.
Figure 7:
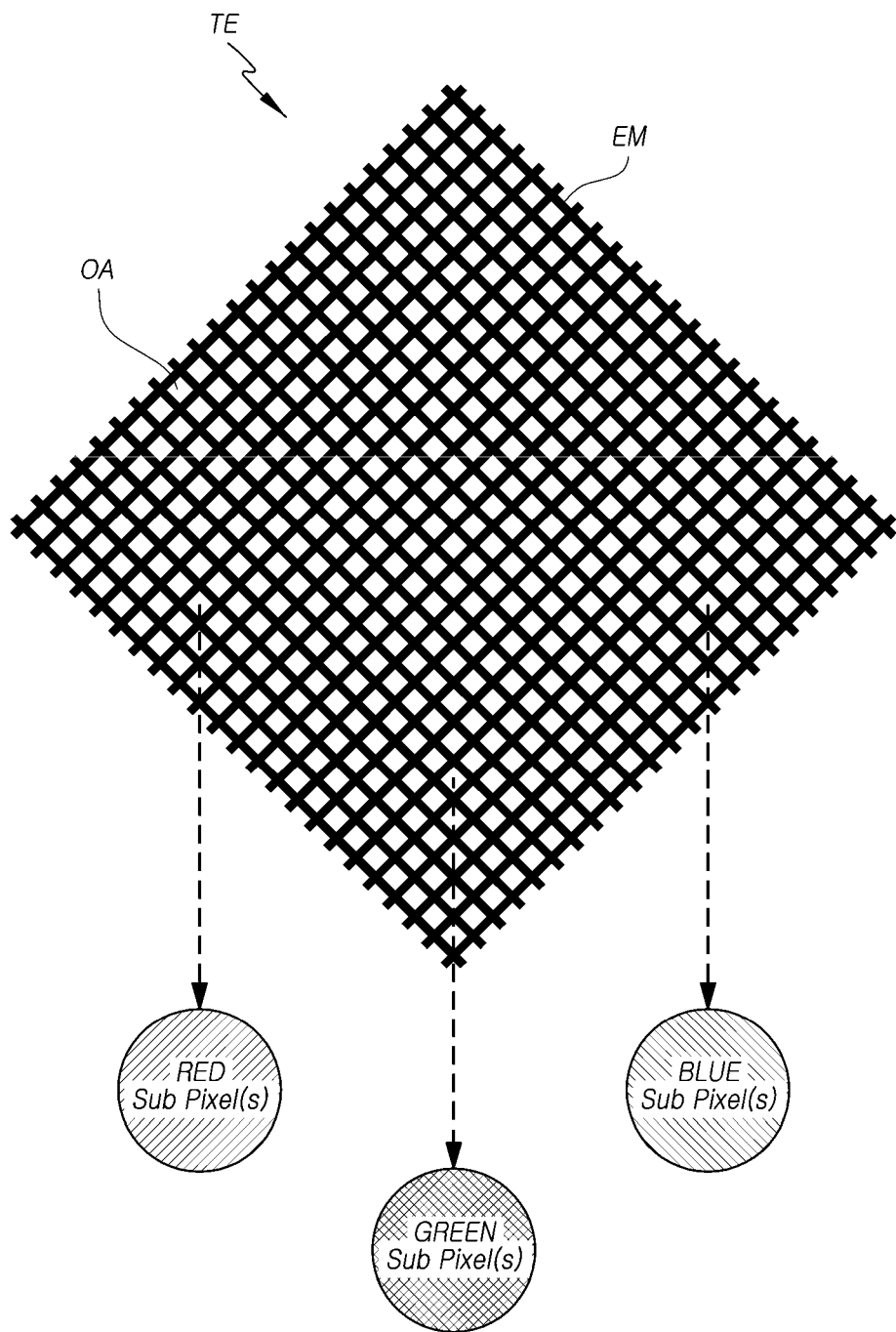
FIG. 7 is a diagram for explaining a correspondence relationship between a mesh-type touch electrode TE disposed on a touch panel TSP and sub-pixels in the display device according to the embodiments of the present disclosure.
Figure 8:
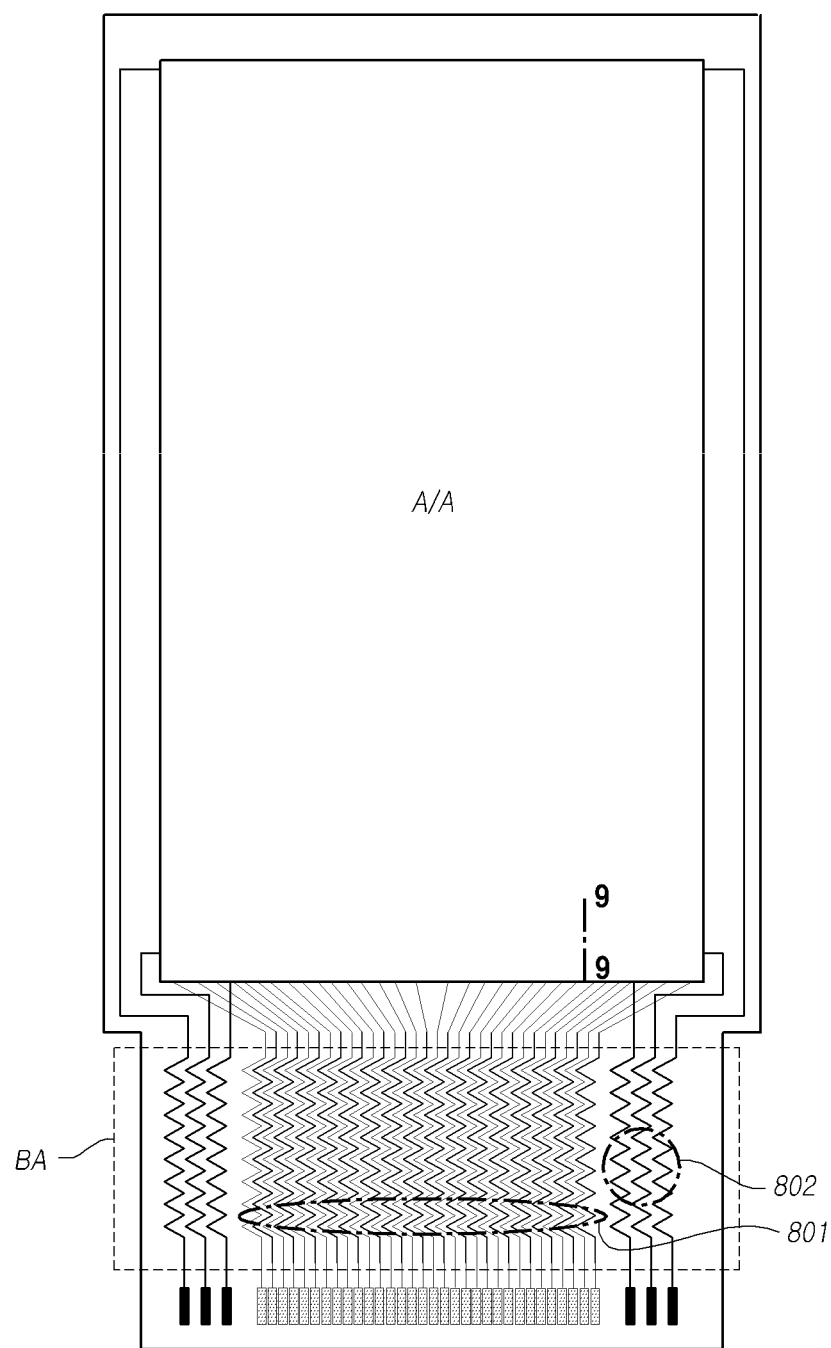
FIG. 8 is a diagram illustrating a structure in which touch lines and data link lines are disposed in a non-display area according to a touch sensor structure of the display panel according to the embodiments of the present disclosure.
Figure 9:
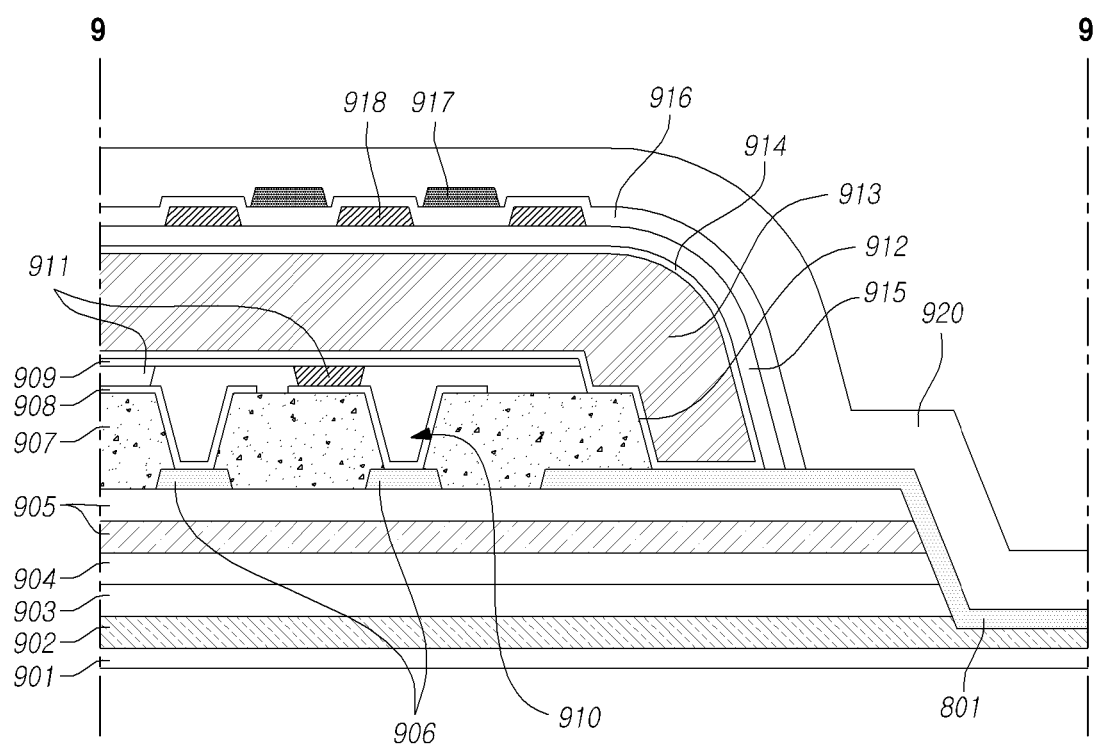
FIG. 9 is a cross-sectional view taken along 9-9 in FIG. 8.
Figure 10:
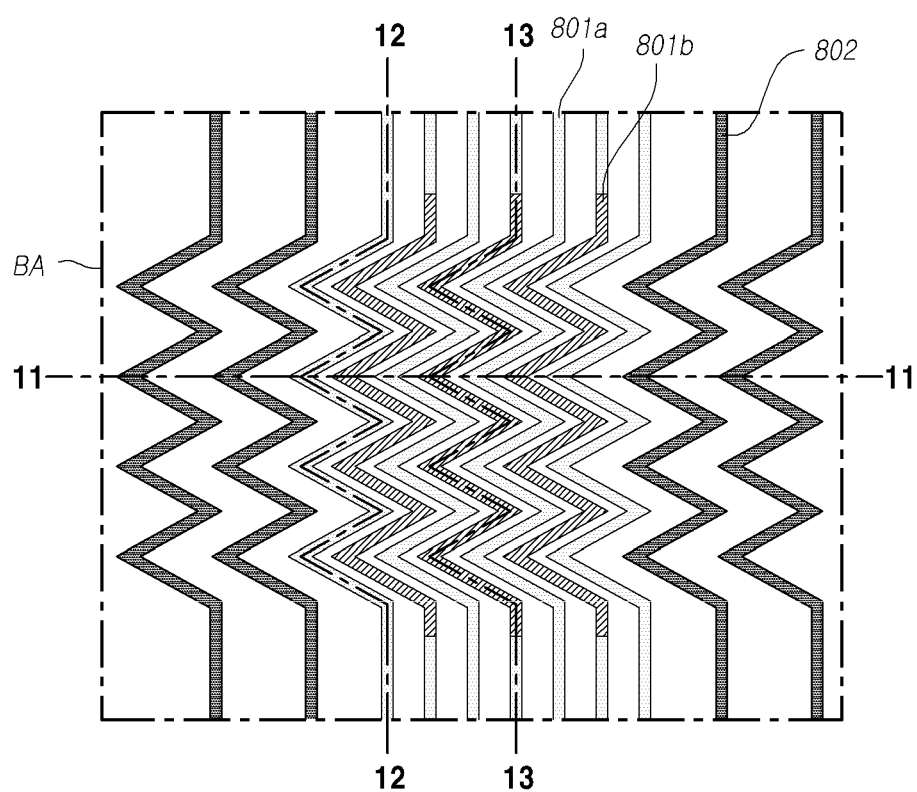
FIG. 10 is a diagram schematically illustrating the touch lines and data link lines disposed in the bendable area of FIG. 8 according to an embodiment of the present disclosure.
Figure 11:
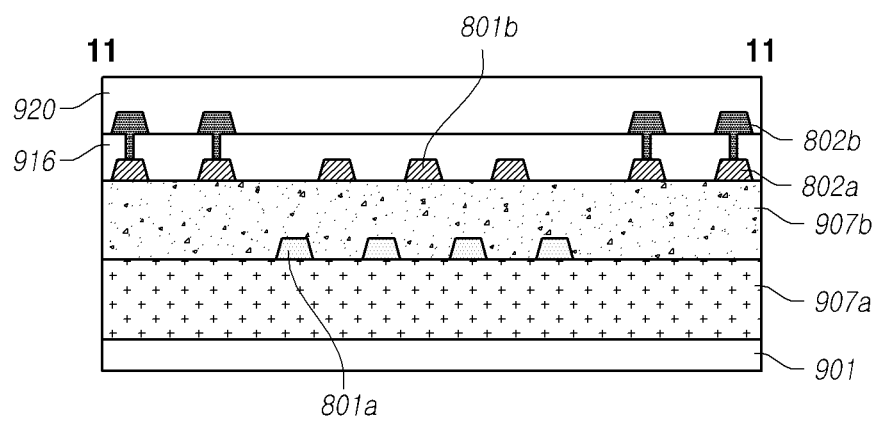
FIG. 11 is a cross-sectional view taken along 11-11 in FIG. 10.
Figure 12:
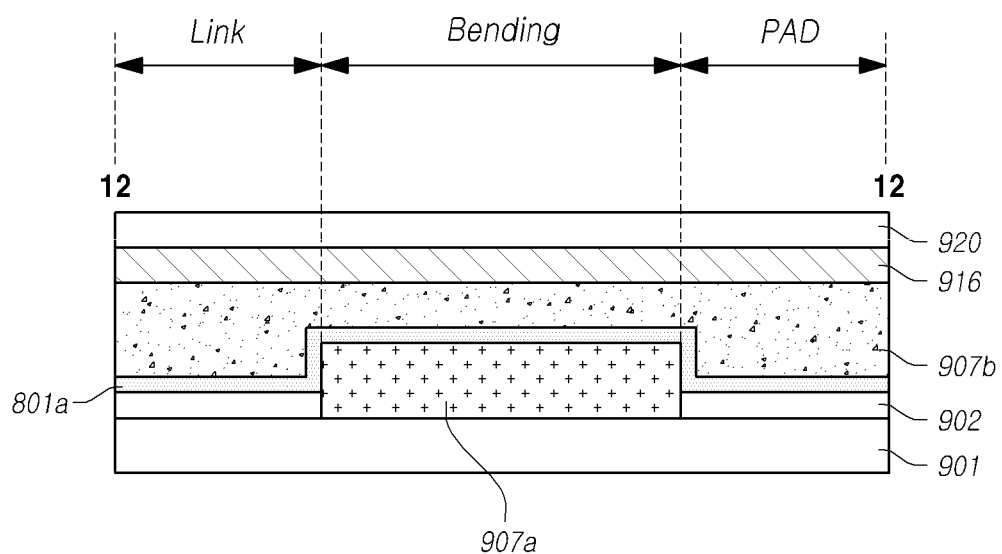
FIG. 12 is a cross-sectional view taken along line 12-12 in FIG. 10.
Figure 13:
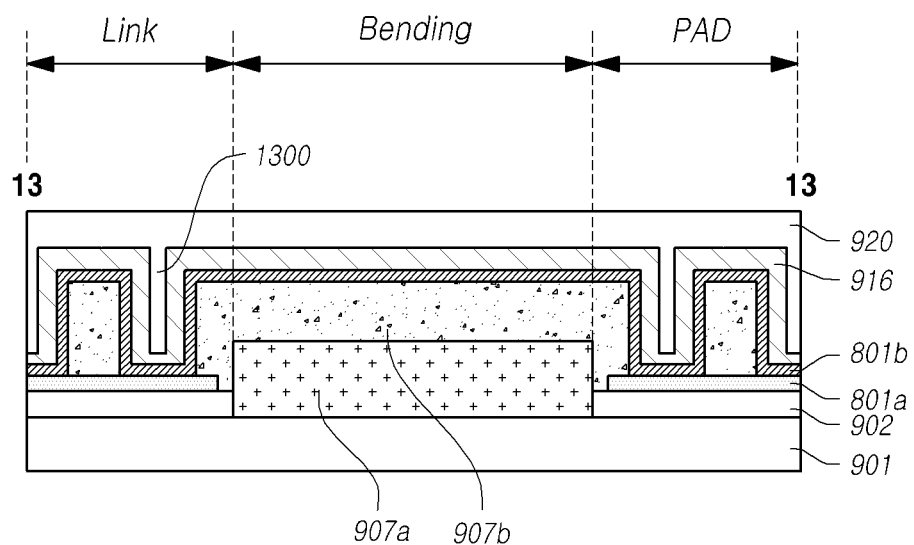
FIG. 13 is a cross-sectional view taken along line 13-13 in FIG. 10.
Figure 14:
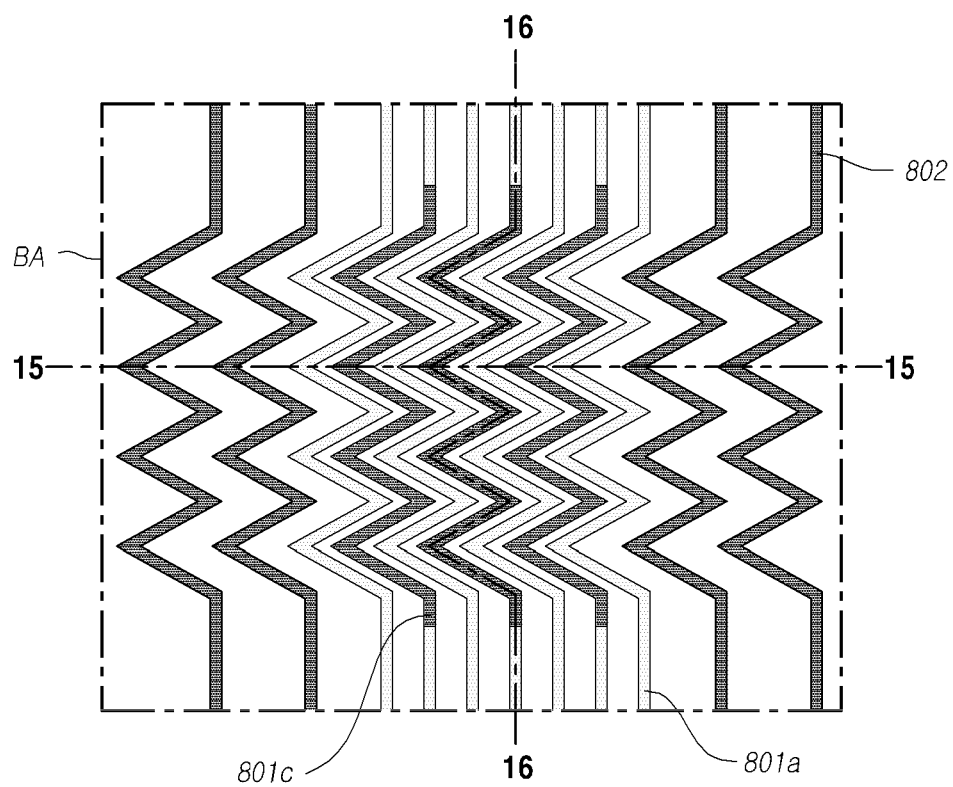
FIG. 14 is a diagram schematically illustrating the touch lines and data link lines disposed in the bendable area of FIG. 8 according to another embodiment of the present disclosure.
Figure 15:
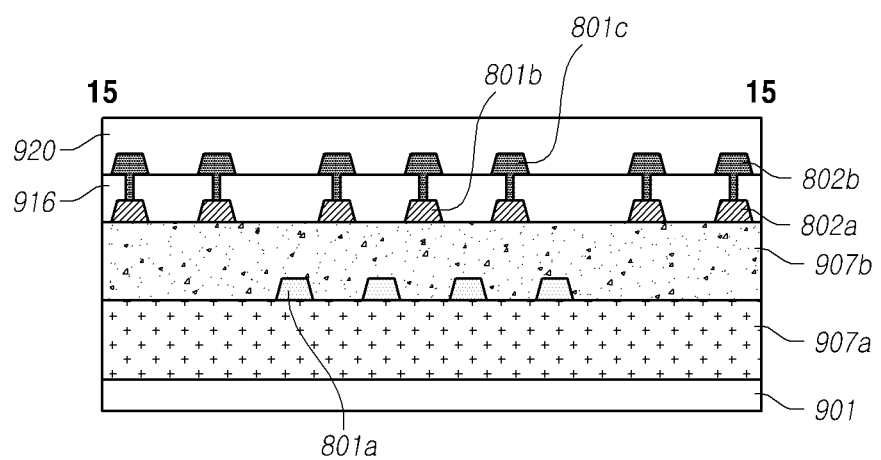
FIG. 15 is a cross-sectional view taken along 15-15 in FIG. 14.
Figure 16:
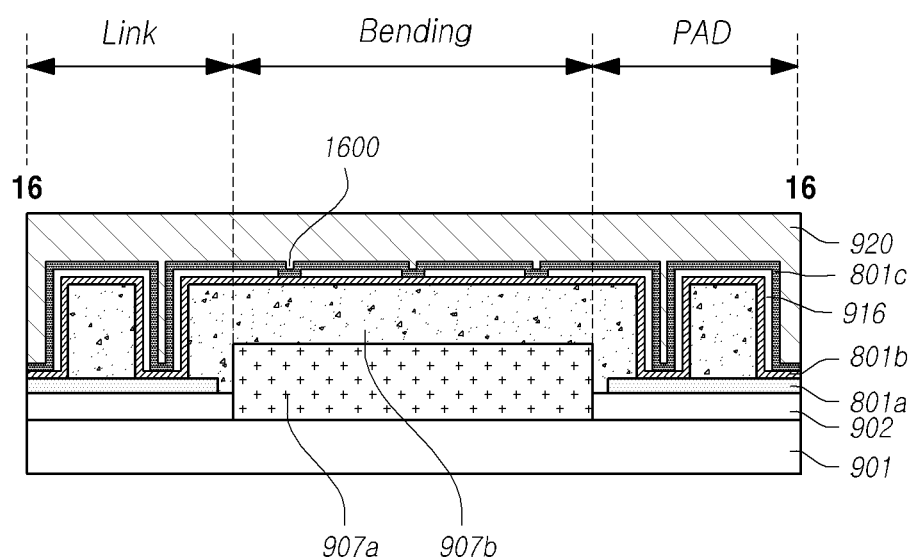
FIG. 16 is a cross-sectional view taken along line 16-16 in FIG. 14.
Figure 17:
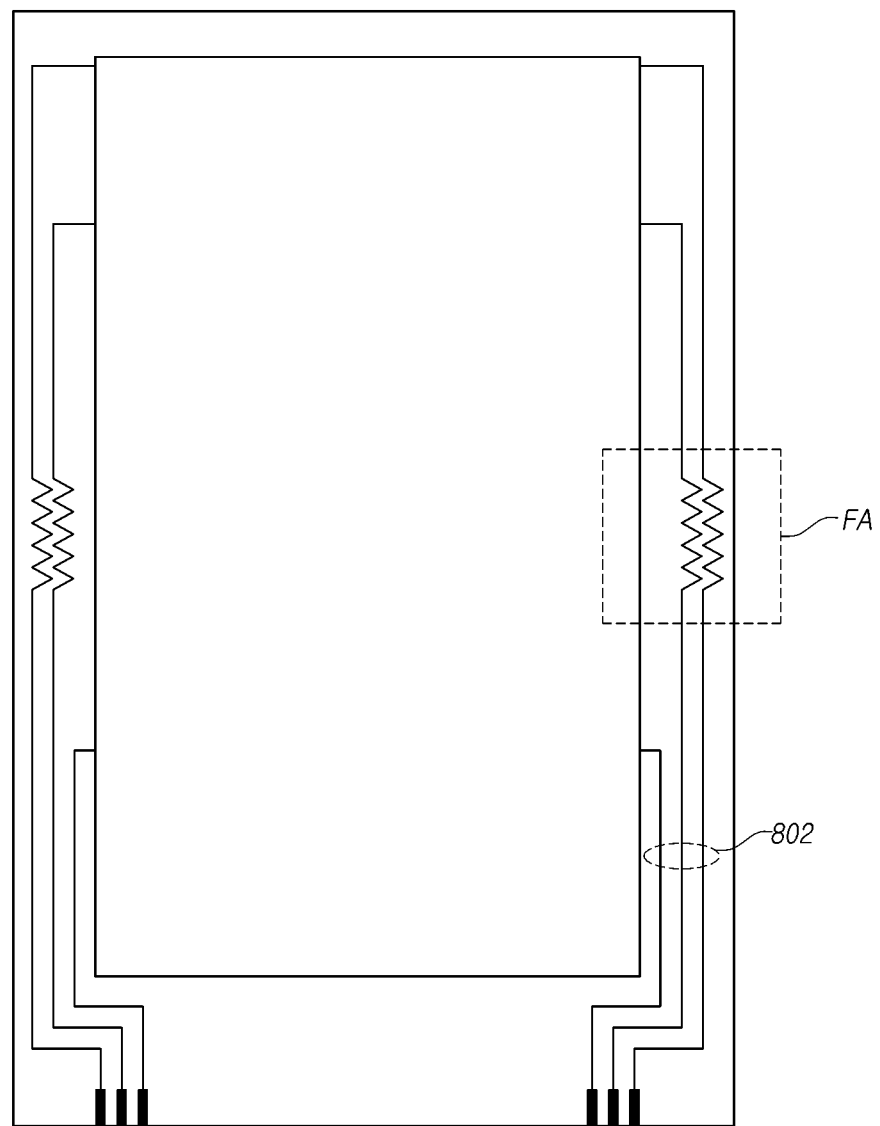
FIG. 17 is a diagram illustrating a structure in which touch lines are disposed in a non-display area according to a touch sensor structure of the display panel according to the embodiments of the present disclosure.
Figure 18:
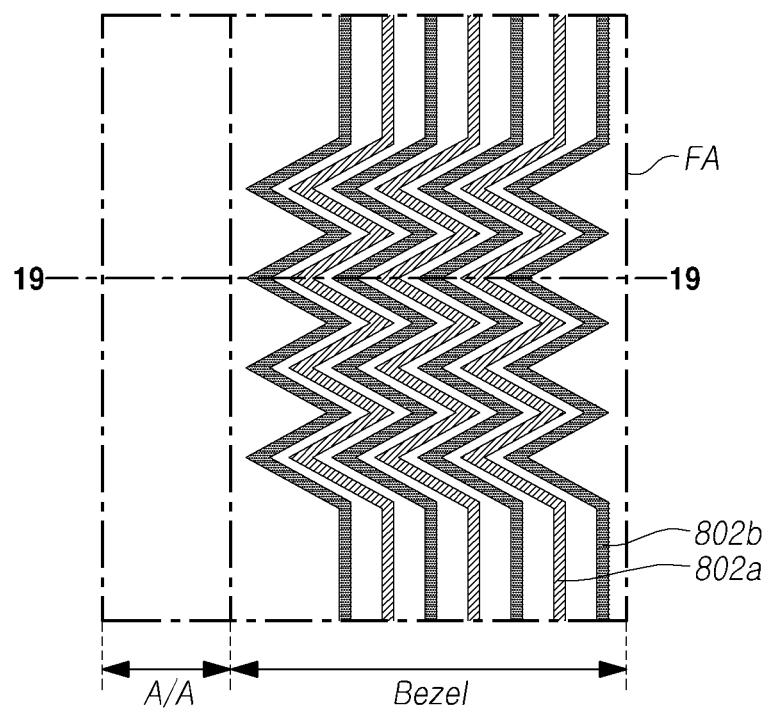
FIG. 18 is a diagram illustrating a portion of FIG. 17 according to an embodiment of the present disclosure.
Figure 19:
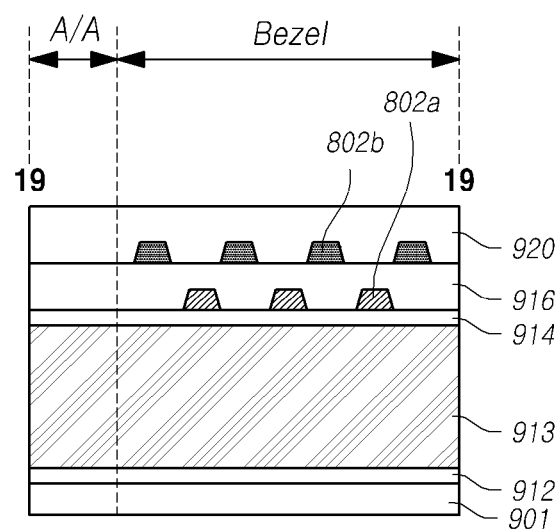
FIG. 19 is a cross-sectional view taken along line 19-19 in FIG. 18.
Figure 20:
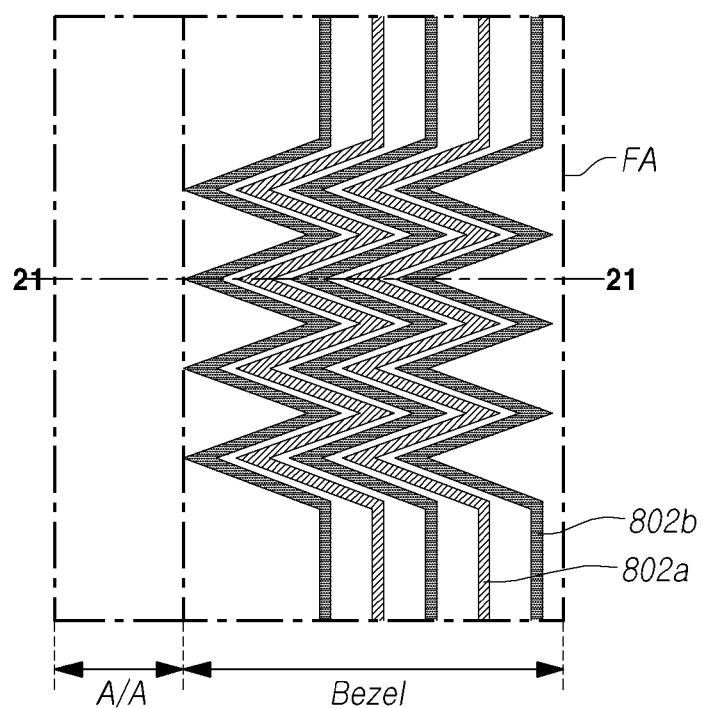
FIG. 20 is a diagram illustrating a portion of FIG. 17 according to another embodiment of the present disclosure.
Figure 21:
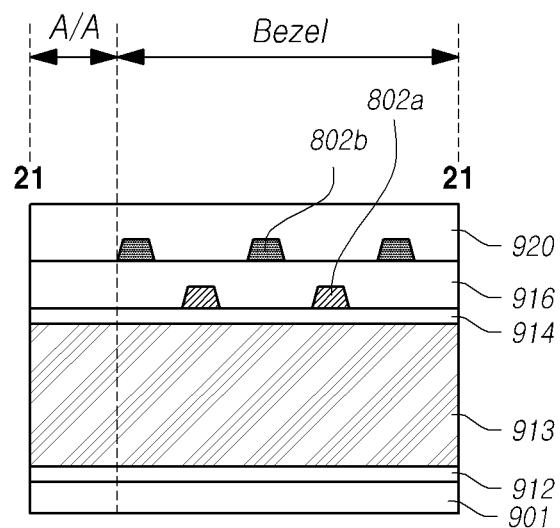
FIG. 21 is a cross-sectional view taken along line 21-21 in FIG. 20.
Figure 22:
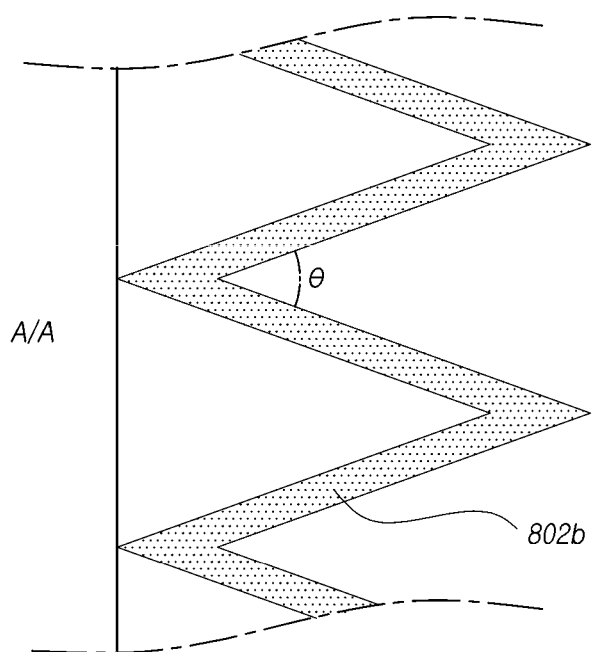
FIG. 22 is a diagram illustrating a partial configuration in FIG. 21 in more detail.

FIG. 1 is a system configuration diagram of a display device according to embodiments of the present disclosure, FIG. 2 is a diagram schematically illustrating a touch sensor structure within a touch area of the display panel according to the embodiments of the present disclosure, FIG. 3 is an exemplary diagram illustrating a touch sensor structure within a touch area of the display panel according to the embodiments of the present disclosure, and FIG. 4 is another exemplary diagram of a touch panel in the display device according to the embodiments of the present disclosure. FIG. 5 is a diagram illustrating a non-mesh-type touch electrode in the display panel according to the embodiments of the present disclosure, FIG. 6 is a diagram illustrating a mesh-type touch electrode in the touch panel according to the embodiments of the present disclosure, and FIG. 7 is a diagram for explaining a correspondence relationship between a mesh-type touch electrode TE and sub-pixels arranged on a touch panel TSP in the display device according to the embodiments of the present disclosure. FIG. 8 is a diagram illustrating a structure in which touch lines and data link lines are disposed in a non-display area according to a touch sensor structure of the display panel according to the embodiments of the present disclosure, FIG. 9 is a cross-sectional view taken along line 9-9 in FIG. 8, FIG. 10 is a diagram schematically illustrating the touch lines and data link lines disposed in the bendable area of FIG. 8 according to an embodiment of the present disclosure, FIG. 11 is a cross-sectional view taken along line 11-11 in FIG. 10, FIG. 12 is a cross-sectional view taken along line 12-12 in FIG. 10, and FIG. 13 is a cross-sectional view taken along line 13-13 in FIG. 10. FIG. 14 is a diagram schematically illustrating the touch lines and data link lines disposed in the bendable area of FIG. 8 according to another embodiment of the present disclosure, FIG. 15 is a cross-sectional view taken along line 15-15 in FIG. 14, and FIG. 16 is a cross-sectional view taken along line 16-16 in FIG. 14. FIG. 17 is a diagram illustrating a structure in which touch lines are disposed in a non-display area according to a touch sensor structure of the display panel according to the embodiments of the present disclosure, FIG. 18 is a diagram illustrating a portion of FIG. 17 according to an embodiment of the present disclosure, FIG. 19 is a cross-sectional view taken along line 19-19 in FIG. 18, FIG. 20 is a diagram illustrating a portion of FIG. 17 according to another embodiment of the present disclosure, FIG. 21 is a cross-sectional view taken along line 21-21 in FIG. 20, and FIG. 22 is a diagram illustrating a partial configuration in FIG. 21 in more detail.

FIG. 1 is a system configuration diagram of a display device according to embodiments of the present disclosure.

Referring to FIG. 1, a display device according to embodiments of the present disclosure may provide an image display function for displaying images and a touch sensing function for sensing a user's touch.

A display device according to the embodiments of the present disclosure may include: a display panel DISP in which a plurality of data lines and a plurality of gate lines are arranged for image display and a plurality of sub pixels defined by the plurality of data lines and the plurality of gate lines are arranged; a display driving circuit configured to drive the plurality of data lines and the plurality of gate lines; and the like.

The display driving circuit may include a data driving circuit DDC configured to drive data lines, a gate driving circuit GDC configured to drive gate lines, a display controller D-CTR configured to control the data driving circuit DDC and the gate driving circuit GDC, and the like.

The display device according to the embodiments of the present disclosure may include a touch panel TSP, in which a plurality of touch electrodes TE are disposed or arranged on, as a touch sensor for touch sensing, and a touch sensing circuit TSC configured to perform driving and sensing processing of the touch panel TSP, and the like.

The touch sensing circuit TSC supplies a driving signal to the touch panel TSP in order to drive the touch panel TSP, detects a sensing signal from the touch panel TSP, and senses presence or absence of a touch and/or a touch position (touch coordinates).

Such a touch sensing circuit TSC may include a touch driving circuit TDC configured to supply a driving signal and to receive a sensing signal, a touch controller T-CTR configured to calculate presence or absence of a touch and/or a touch position (touch coordinates), and the like.

The touch sensing circuit TSC may be implemented with one or more components (e.g., integrated circuits), and may be implemented separately from the display driving circuit.

In addition, the entirety or a part of the touch sensing circuit TSC may be integrated with the display driving circuit and one or more of the internal circuits of the display driving circuit. For example, the touch driving circuit TDC of the touch sensing circuit TSC can be implemented as an integrated circuit together with the data driving circuit DDC of the display driving circuit.

Meanwhile, the display device according to the embodiments of the present disclosure is capable of sensing a touch based on a capacitance formed on the touch electrodes TE.

The display device according to the embodiments of the present disclosure adopts a capacitance-based touch sensing scheme, in which a touch may be sensed by a mutual-capacitance-based touch sensing scheme or by a self-capacitance-based touch sensing scheme.

FIGS. 2 to 4 are three exemplary diagrams of a touch panel TSP in the display device according to the embodiments of the present disclosure, in which FIGS. 2 and 3 are exemplary diagrams of a touch panel TSP when the display device according to the embodiments of the present disclosure senses a touch by the mutual-capacitance-based touch sensing scheme and FIG. 4 is an exemplary diagram of a touch panel TSP when the display device according to the embodiments of the present disclosure senses a touch by the self-capacitance-based touch sensing scheme.

Referring to FIGS. 2 and 3, in the case of the mutual-capacitance based touch sensing scheme, a plurality of touch electrodes TE arranged in a touch panel TSP may be classified into a driving touch electrode (also referred to as a driving electrode, a transmission electrode, or a driving line) to which a driving signal is applied, and a sensing touch electrode (also referred to as a sensing electrode, a reception electrode, or a sensing line) from which a sensing signal is sensed and which forms a capacitance with the driving electrode.

Referring to FIGS. 2 and 3, among driving touch electrodes (Driving TE) in the touch electrodes TE, the driving touch electrodes arranged in the same row (or the same column) are electrically connected to each other by an integration method (or by a connection method using a bridge pattern) so as to form one driving touch electrode line DEL.

Referring to FIGS. 2 and 3, among sensing touch electrodes (Sensing TE) in the touch electrodes TE, the sensing touch electrodes arranged in the same column (or the same row) are electrically connected to each other by a bridge pattern BP (or by an integration method) so as to form one sensing touch electrode line SEL.

In the case of the mutual-capacitance-based touch sensing scheme, the touch sensing circuit TSC applies a driving signal to one or more driving touch electrode lines DEL and receives a sensing signal from one or more sensing touch electrode lines SEL. Based on the received sensing signal, the presence or absence and/or coordinates of a touch are detected based on a change in capacitance (mutual-capacitance) between the driving touch electrode lines DEL and the sensing touch electrode lines SEL depending on the presence or absence of a pointer such as a finger or a pen.

Referring to FIGS. 2 and 3, for driving signal transmission and sensing signal transmission, each of the plurality of driving touch electrode lines DEL and each of the plurality of sensing touch electrode lines SEL are electrically connected to a touch driving circuit TDC via one or more touch lines TL.

More specifically, for driving signal transmission, each of the plurality of driving touch electrode lines DEL is electrically connected to the touch driving circuit TDC via one or more driving touch lines TLd. For sensing signal transmission, each of the plurality of sensing touch electrode lines SEL is electrically connected to the touch driving circuit TDC via one or more sensing touch lines TLs.

Referring to FIG. 4, in the case of the self-capacitance-based touch sensing scheme, each touch electrode TE disposed in the touch panel TSP has both the role of a driving touch electrode (driving signal application) and the role of a sensing touch electrode (sensing signal detection).

That is, a driving signal is applied to each touch electrode TE, and a sensing signal is received via the touch electrode TE to which the driving signal is applied. Therefore, in the self-capacitance-based touch sensing scheme, a driving electrode and a sensing electrode are not separately distinguished from each other.

In the case of the self-capacitance-based touch sensing scheme, the touch sensing circuit TSC applies a driving signal to at least one touch electrode TE, receives a sensing signal from the touch electrode TE to which a driving signal is applied, and detects the presence or absence and/or coordinates of a touch based on a change in capacitance between a pointer such as a finger or a pen and the touch electrode TE, based on the received sensing signal.

Referring to FIG. 4, for driving signal transmission and sensing signal transmission, each of the plurality of touch electrodes TE is electrically connected to the touch driving circuit TDC via one or more touch lines TL.

In this way, the display device according to the embodiments of the present disclosure may sense a touch by the mutual-capacitance-based touch sensing scheme, or may sense a touch by the self-capacitance-based touch sensing scheme.

Hereinafter, for the convenience of explanation, it is assumed that the mutual-capacitance-based touch sensing scheme is applied to the display device and the touch panel TSP according to the embodiments of the present disclosure. However, the self-capacitance-based touch sensing scheme may also be equally applied to the display device and the touch panel TSP according to the embodiments of the present disclosure.

Meanwhile, in the display device according to the embodiments of the present disclosure, the touch panel TSP may be of an externally-attached type manufactured separately from a display panel DISP and bonded to the display panel DISP, or may be of a built-in type which is manufactured together with the display panel DISP and is present inside the display panel DISP.

Hereinafter, for the convenience of explanation, it is assumed that the touch panel TSP is of a built-in type in which the touch panel TSP exists inside the display panel DISP. In this case, the touch electrodes TE and the touch lines TL are electrodes and signal lines existing inside the display panel DISP.

Meanwhile, the display panel DISP of the display device according to the embodiments of the present disclosure may be of various types such as an OLED panel and an LCD panel. Hereinafter, for the convenience of explanation, an OLED panel will be mainly described as an example.

FIG. 5 is a diagram illustrating a non-mesh-type touch electrode TE disposed on the touch panel TSP in the display device according to the embodiments of the present disclosure.

Referring to FIG. 5, in the display device according to the embodiments of the present disclosure, each of the plurality of touch electrodes TE disposed on the touch panel TSP may be of a non-mesh type.

The non-mesh-type touch electrode TE may be a plate-shaped metal electrode having no open area.

In this case, the touch electrodes TE may be transparent electrodes.

FIG. 6 is a diagram illustrating a mesh-type touch electrode disposed on a touch panel TSP in the display device according to the embodiments of the present disclosure.

Referring to FIG. 6, in the display device according to the embodiments of the present disclosure, each of the plurality of touch electrodes TE disposed on the touch panel TSP may be of a mesh type.

The mesh-type touch electrode TE may be made of an electrode metal EM patterned in a mesh type.

Accordingly, a plurality of open areas OA may exist in the area of the mesh-type touch electrode TE.

FIG. 7 is a diagram for explaining a correspondence relationship between a mesh-type touch electrode TE disposed on a touch panel TSP and sub-pixels in the display device according to the embodiments of the present disclosure.

Referring to FIG. 7, each of the plurality of open areas OA, existing in the area of a touch electrode TE made of an electrode metal EM patterned in a mesh type, may correspond to a light-emitting region of one or more sub-pixels.

For example, each of the plurality of open areas OA, existing in the area of one touch electrode TE, may correspond to at least one of red, green, and blue sub-pixels.

As another example, each of the plurality of open areas OA, existing in the area of one touch electrode TE, may correspond to at least one of red, green, blue, and white sub-pixels.

As described above, since the light-emitting area of one or more sub-pixels exists in each of the open areas OA of each touch electrode TE in a plan view, it is possible to further increase the opening ratio and light emission efficiency of a display panel DISP while enabling touch sensing.

As described above, the outline of one touch electrode TE may have an approximately rhombic or rectangular shape (including a square shape), for example, and an open area OA corresponding to a hole in one touch electrode TE may also have a rhombic or rectangular shape (including a square shape), for example.

However, the shape of the touch electrode TE and the shape of the open area OA may be variously modified and designed in consideration of the shape of sub-pixels, the arrangement structure of the sub-pixels, touch sensitivity, and the like.

FIG. 8 is a diagram illustrating a structure in which touch lines and data link lines are disposed in a non-display area according to a touch sensor structure of the display panel according to the embodiments of the present disclosure.

Referring to FIG. 8, a plurality of data link lines 801 and a plurality of touch lines 802 are disposed on the non-display area which is an outer area of the display area A/A of the display panel DISP.

The data link lines 801 may be formed by extending the data lines DL or may be electrically connected to the data lines DL. The data link lines 801 may be formed of a material, which is the same as or different from the material of the data lines DL, and may be disposed on a layer, which is the same as or different from the layer of the data lines DL.

The touch lines 802 are electrically connected to the touch electrodes TE and may be formed of the same material as an electrode metal EM that forms the touch electrode TE.

A data pad is provided at the end of each data link line 801 to be electrically connected to the data driving circuit DDC. A touch pad is provided at an end of each touch line 802 to be electrically connected to the touch driver circuit TDC.

On the other hand, the plurality of data link lines 801 and the plurality of touch lines 802, disposed on the non-display area, may be disposed in a first bendable area BA which may be the entire non-display area or a portion of the non-display area.

The first bendable area BA may become a bent area by bending a portion of the substrate of the display panel DISP. In this case, since the data link lines 801 and the touch lines 802 themselves are bent, electrical connection to the data driving circuit DDC or the touch driving circuit TDC can be more easily performed.

FIG. 9 is a cross-sectional view of a portion of FIG. 8.

FIG. 9 is a cross-sectional view taken along line 9-9 in FIG. 8. The cross-sectional structure of the display panel DISP will be described with reference to FIG. 9.

A polyimide layer 901 is placed on a substrate or a back plate.

The polyimide layer 901 may be placed on the substrate or may be present without the substrate.

Further, only the substrate may be present without the polyimide layer 901. That is, in this case, the substrate may be regarded as the polyimide layer 901. Here, the substrate may be flexible or non-flexible.

In order to form an OLED on the polyimide layer 901, a plurality of inorganic film layers are provided.

More specifically, the first buffer layer 902 and the second buffer layer 903 are placed and a gate insulating film 904 and a multilayered insulating film 905 are placed on the second buffer layer 903.

A source/drain layer is present on an inorganic film layer.

On the source/drain layer, various signal lines such as data lines DL and source/drain electrodes 906 of various transistors are formed in a display area A/A.

Further, the data link line 801 or the like may be formed in a non-display area in the same layer as the source/drain layer.

A planarization layer 907 made of an organic material is placed on the source/drain layer.

On the planarization layer 907, a first electrode 908 is located at the light-emitting position of each sub-pixel, and a bank 910 is placed on the first electrode 908. Here, since the first electrode 908 is present in each sub-pixel, the first electrode 908 may be called a pixel electrode.

In addition, an organic light-emitting layer 911 is placed on the first electrode 911 between two adjacent banks 910.

A second electrode 909 is placed on the organic light-emitting layer 911. Here, the second electrode 909 may be a common electrode formed in common to all sub-pixel areas.

On the second electrode 909, an encapsulation layer for preventing penetration of moisture, air, and the like may be present.

The encapsulation layer may be laminated in a single layer or in two or more layers. Further, the encapsulation layer may be formed of a metallic layer, or may be formed by laminating organic and inorganic layers in two or more layers.

FIG. 9 illustrates a case in which the encapsulation layer 914 is formed by laminating a first encapsulation layer 912, a second encapsulation layer 913, and a third encapsulation layer 914. Here, the first encapsulation layer 912 may be a first inorganic film, the second encapsulation layer 913 may be an organic film, and the third encapsulation layer 913 may be a second inorganic film.

A touch buffer layer 915 is placed on the encapsulation layer or the third sealing layer 913 and the touch insulating film 916 is placed on the touch buffer layer 915.

On the touch insulating film 916, touch electrodes 917 (TE) are formed. The touch electrodes 917 illustrated in FIG. 9 may be driving touch electrodes TEd or sensing touch electrodes TEs.

Meanwhile, bridge patterns 918 (BP) may be formed between the touch buffer layer 915 and the touch insulating film 916.

When the touch electrodes 917 are the driving touch electrodes TEd, the bridge patterns 918 connect two or more sensing touch electrodes TEs, and when the touch electrodes 917 are the sensing touch electrodes TEs, the bridge patterns 918 connect two or more driving touch electrodes TEd.

The touch electrodes 917 and the bridge patterns 918 are made of an electrode metal EM. The touch electrodes 917 and the bridge patterns 918 may be patterned as a mesh having a plurality of open areas therein; at least some of the open areas correspond to a light-emitting area of at least one sub-pixel.

A protective film 920 is placed on the touch insulating film 916 and the touch electrodes 917. The protective film 920 may extend from the display area A/A to the non-display area.

FIG. 10 is a diagram schematically illustrating the touch lines and data link lines disposed in the first bendable area BA of FIG. 8 according to an embodiment of the present disclosure.

Referring to FIG. 10, the plurality of data link lines 801 and the plurality of touch lines 802 are disposed in the first bendable area BA of FIG. 8. FIG. 10 only illustrates some of the data link lines 801 and the touch lines 802 of FIG. 10 schematically.

The plurality of data link lines 801 and the plurality of touch lines 802 disposed on the first bendable area BA may be disposed on the same plane while forming a zigzag pattern.

When the plurality of data link lines 801 and the plurality of touch lines 802 form a zigzag pattern in the first bendable area BA, the damage of the data link lines 801 and the touch lines 802 may be minimized, despite an external force applied due to the curvature of the first bendable area BA when the first bendable area BA is bent.

FIG. 11 is a cross-sectional view of a portion of FIG. 10. Specifically, FIG. 11 is a cross-sectional view taken along line 11-11 in FIG. 10.

Referring to FIG. 11, a structure, in which a polyimide layer 901, a first planarization layer 907a, a second planarization layer 907b, a touch insulating film 916, and a protection film 920 are laminated, is illustrated in the cross section of the first bendable area BA of FIG. 8.

The plurality of data link lines 801 is disposed on the first planarization layer 907a in the first bendable area BA.

The plurality of data link lines 801 may be made of a source/drain metal. Alternatively, the plurality of data link lines may be made of another metal or another conductive material.

Meanwhile, when the plurality of data link lines 801 are only disposed on the same layer, for example, on the first planarization layer 907a, inter-line short-circuit may occur as the number of lines increase. Thus, there is a limit in increasing the number of lines.

Accordingly, the plurality of data link lines 801 may be alternately disposed in two or more layers in the first bendable area BA.

More specifically, some of the plurality of data link lines 801 are disposed on the first planarization layer 907a, and the remaining data link lines 801 are disposed on the second planarization layer 907b. Thus, the plurality of data link lines 801 is disposed in two or more layers.

In addition, the plurality of data link lines 801 disposed in two or more layers may be alternately disposed, which is for a structure in which the plurality of data link lines 801 disposed on the same layer are disposed in the first bendable area BA in such a manner that some of the plurality of data link lines 801 are located to jump to another layer and the remaining data link lines 801 are located on the existing layer. In other words, the plurality of data link lines 801 on the first planarization layer 907a may not align with the plurality of data link lines 801 on the second planarization layer 907b.

When the plurality of data link lines 801 are alternately disposed in two or more layers, more lines than the link lines 801, which are disposed on the same layer, may be included.

In this case, the line disposed on a first one of the two or more layers may be defined as first data link lines 801a, and data link lines disposed on a second layer of two or more layers may be defined as second data link lines 801b.

The second data link lines 801b are disposed on a first layer and the first data link lines 801a are disposed on a second layer. The first layer may be referred to herein as an upper layer, and the second layer may be referred to herein as a lower layer. The upper layer is a layer further away from the polyamide layer 901 than the lower layer. For example, the second data link lines 801b may be disposed on the second planarization layer 907b, and the first data link lines 801a may be disposed on the first planarization layer 907a.

Meanwhile, the plurality of touch lines 802 is disposed on the second planarization layer 907b of the first bendable area BA.

The plurality of touch lines 802 may be formed of an electrode metal EM. Alternatively, the plurality of data link lines may be made of another metal or another conductive material.

However, the plurality of touch lines 802 may include touch lines 802b, which are connected to the touch electrodes 917, and touch lines 802a, which are connected to a bridge pattern 918, in which the touch lines 802b and the touch lines 802a are dually disposed in different layers. For example, the touch lines 802b connected to the touch electrodes 917 may be disposed in a layer positioned higher than the touch lines 802a connected to the bridge pattern 918.

Specifically, the touch lines 802b connected to the touch electrodes 917 may be disposed on the touch insulating film 916 and the touch lines 802a connected to the bridge pattern 918 may be disposed on the second planarization layer 907b.

In this case, the data link lines 801 disposed on one of the two or more layers may be made of the same metal as at least one touch line 802 among the plurality of touch lines 802. In this case, the metal may be an electrode metal EM. Alternatively, the data link lines 801 disposed on one of the two or more layers may be made of another metal or another conductive material.

The bridge patterns 918 or the plurality of touch electrodes 917 may be arranged to overlap the bank 910 of at least one sub-pixel.

When the data link lines 801 are divided into the first data link lines 801a and the second data link lines 801b, the second data link lines 801b may be connected to at least one of the plurality of touch lines 802 and may be made of the same metal as the touch lines 802.

That is, the second data link lines 801b disposed on the upper layer may be formed of the same metal as the at least one touch line 802 among the plurality of touch lines 802. Thus, the metal constituting the first data link lines 801a and the metal constituting the second data link lines 801b may be different from each other.

Meanwhile, the second data link lines 801b may be disposed on the same layer as the touch lines 802a and may be made of the electrode metal EM that constitutes the touch lines 802a. Since the second data link lines 801b and the touch lines 802a may be simultaneously manufactured in the same process, it is not necessary to perform a separate process for applying the alternate structure.

In this case, the first data link lines 801a are disposed on the first planarization layer 907a and are made of a source/drain metal, and the second data link lines 802b are disposed on the second planarization layer 907b and are made of an electrode metal EM.

FIG. 12 is a cross-sectional view taken along line 12-12 in FIG. 10, and FIG. 13 is a cross-sectional view taken along line 13-13 in FIG. 10.

Referring to FIG. 12, in the cross section along line 12-12 in FIG. 10, the first data link line 801a is continuously disposed from a link area of the outer non-display area of the display panel DISP to a pad area.

Meanwhile, referring to FIG. 13, in the cross section along line 13-13 in FIG. 10, the first data link line 801a extends from the link area of the outer non-display area of the display panel DISP to the first bendable area BA and is discontinuous in the first bendable area BA. The first data link line 801a is separated into two portions by the first planarization layer 907a which results in the discontinuity of the first data link line 801a in the first bendable area BA.

Instead, the first data link line 801a is electrically connected to the second data link line 801b, which is located at the upper layer, by at least one via hole 1300.

Therefore, the first data link line 801a in the cross section along line 12-12 in FIG. 10 is disposed on the first planarization layer 907a in the first bendable area BA so as to transmit a signal, and the first data link line 801a in the cross section along line 13-13 in FIG. 10 jumps onto the second planarization layer 907b in the first bendable area BA and transmits a signal to the second data link line 801b disposed on the second planarization layer 907b.

In the pad region on the right of the first bendable area BA, the second data link line 801b, disposed on the second planarization layer 907b in the cross section along line 13-13 in FIG. 10, is again electrically connected to the first data link line 801a, disposed on the first planarization layer 907a, by a via hole 1300 which passes through the second planarization layer 907b.

With this structure, the data link lines 801 are alternately placed in different layers only in the first bendable area BA where the space restriction is more severe, and in the areas other than the first bendable area BA, the data link lines 801 are placed on the same layer, thereby making it possible to have an efficient line structure without applying the alternate structure to the entire non-display area.

Although not shown in FIG. 13, the touch buffer layer 915 may also be located in the PAD area between the second planarization layer 907b and the touch insulating film 916. As for the arrangement in which there is no touch buffer layer 915 in the PAD area, again the second data link line 801b is electrically connected to the first data link line 801a via the via hole 1300. In this case, the second data link line 801b is formed on the touch buffer layer 915. Therefore, the via hole 1300 passes through both the second planarization layer 907b and the touch buffer layer 915 to allow electrical contact of the second data link line 801b and the first data link line 801a.

As the touch insulating film 916 is disposed on the second data link line 801b, the touch insulating film 916 defines the via hole 1300 as shown in FIG. 13.

Similarly, the plurality of touch lines 802, disposed on the touch insulating film 916, may extend to the pad area. Such touch lines may connect to the first data link line 801a in the pad area via a touch contact hole such that the touch lines are electrically connected to the first data link line 801a. The touch contact hole may therefore pass through the touch insulating film 916, the second planarization layer 907b and the touch buffer layer 915. In this way, the touch sensor 917 is connected to the touch driving circuit via the electrical connection of the touch lines to the first data link line 801a.

Touch line connects to first data link line 801a by a via hole in the pad area. First data link line 801a electrically connects to touch line.

FIG. 14 is a diagram schematically illustrating the touch lines and data link lines disposed in the first bendable area of FIG. 8 according to another embodiment of the present disclosure. Descriptions of components, which are the same or similar to those of FIGS. 10 to 13, will be omitted in the following description.

Referring to FIG. 14, the plurality of data link lines 801 and the plurality of touch lines 802 are disposed in the first bendable area BA of FIG. 8.

Unlike FIG. 10, however, some of the data link lines of the plurality of data link lines 801 in FIG. 14 are configured as dual lines in two or more layers again.

FIG. 15 is a cross-sectional view taken along line 15-15 in FIG. 14. More specifically, referring to FIG. 15, the plurality of data link lines 801 may further include, in addition to the first data link lines 801a and the second data link lines 801b, a plurality of third data link lines 801c provided on the layer above the second data link lines 801b so as to overlap the second data link lines 801b.

More specifically, the third data link lines 801c are located on the touch insulating film 916 so as to be located on a layer above the first data link lines 801a and the second data link lines 801b.

The third data link lines 801c may be located on the same layer as the touch lines 802b located on the touch insulating film 916 and may be made of the same metal as the touch lines 802b. In this case, the third data link lines 801c is made of an electrode metal EM. Alternatively, the third data link lines 801c may be made of another metal or another conductive material.

FIG. 16 is a cross-sectional view taken along line 16-16 in FIG. 14. Referring to FIG. 16, the third data link line 801c is located on the touch insulating film 916 which is a layer above the second data link line 801b.

The third data link line 801c is electrically connected to the second data link line 801b through at least one via hole 1600 and is also electrically connected to the first data link line 801a through the second data link line 801b.

When the data link lines 801b and 801c, which pass through the first bendable area BA, are provided as dual lines and the two lines are electrically connected to each other, the resistance of the lines can be lowered, thereby enabling effective signal transmission.

FIG. 17 is a diagram illustrating a structure in which touch lines are disposed in a non-display area according to a touch sensor structure of the display panel according to the embodiments of the present disclosure.

Referring to FIG. 17, the plurality of touch lines 802 is disposed in the non-display area of the display panel DISP, particularly, in a bezel area.

Meanwhile, when the bottom surface of the display panel DISP is only made of the polyimide layer 901 or the substrate is flexible, at least a portion of the display area A/A of the display panel DISP can be folded.

In this case, some of the touch lines of the plurality of touch lines 802 pass the second bendable areas FA of the display panel DISP.

FIG. 18 is a diagram illustrating a second bending portion FA of FIG. 17 according to an embodiment of the present disclosure, and FIG. 19 is a cross-sectional view of a portion of FIG. 18.

Referring to FIG. 18, the plurality of touch lines 802, passing through the second bendable area FA of the display panel DISP, may be disposed on the same plane while forming a zigzag pattern.

When the plurality of touch lines 802 form the zigzag pattern in the second bendable area FA, damage incurred by the touch lines 802 can be minimized, despite the external force applied due to the curvature of the second bendable area FA when the second bendable area FA is bent.

Meanwhile, the plurality of touch lines 802, passing through the second bendable area FA, may be alternately disposed in two or more layers.

Referring to FIG. 19, in the cross-sectional view taken along line 19-19 of FIG. 18, the touch lines 802a are disposed on one of two or more layers, and the touch lines 802b are disposed on another one of the two or more layers.

The touch lines 802a and 802b may be lines electrically connected to the touch electrodes 917 and the bridge pattern 918 as described above.

When the touch lines 802a and 802b are formed in this alternate structure, as compared with a case where the touch lines 802a and 802b are disposed on different layers to overlap the same line as dual lines, it is possible to form respective touch lines 802a and 802b to be closer to each other, thereby implementing a narrow bezel.

FIG. 20 is a diagram illustrating the second bending portion FA of FIG. 17 according to another embodiment of the present disclosure, FIG. 21 is a cross-sectional view taken along line 21-21 of FIG. 20, and FIG. 22 is a diagram illustrating a partial configuration in FIG. 21 in more detail.

Referring to FIG. 20, the touch line 802b closest to the display area A/A of the display panel DISP is in contact with the boundary of the display area A/A, unlike the case illustrated in FIG. 18.

Referring to the cross section of FIG. 21, the touch lines 802a and 802b are alternately disposed, so that the touch lines 802b adjacent to the display area A/A located in the upper layer are capable of being shifted in the same bezel size, and thus it is possible to secure a wider area per one line.

Therefore, when the zigzag angle (see below) of the touch lines 802a and 802b is increased while maintaining the width of the bezel at the same level, the display panel DISP is capable of having a structure more resistant to an external force applied due to the folding of the second bendable area FA, thereby preventing the touch lines 802a and 802b from being cracked.

More specifically, referring to FIG. 22, the zigzag angle of the touch lines 802a and 802b may be variable to a point where the bent portion of the touch line 802b closest to the display area A/A of the display panel DISP meets the boundary of the display area A/A.

That is, when the bent angle of the zigzag pattern of the touch lines 802b is $\theta$, the bent angle $\theta$ of the zigzag pattern may be variable to a range where the bent portions of the touch lines 802b meet the display area A/A of the display panel DISP.

Even if it was described above that all of the components of an embodiment of the present disclosure are coupled as a single unit or coupled to be operated as a single unit, the present disclosure is not necessarily limited to such an embodiment. That is, at least two elements of all structural elements may be selectively joined and operate without departing from the scope of the present disclosure.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although a preferred embodiment of the present disclosure has been described for illustrative purposes, those skilled in the art will appreciate that various modifications, additions and substitutions are possible, without departing from the scope of the disclosure as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

Also disclosed herein are the following numbered clauses:

Clause 1. A touch display device comprising:

a display panel having a display area, in which a plurality of data lines and a plurality of touch electrodes are disposed, and a non-display area, which is an outer area of the display area, and, in which the plurality of data lines extend or a plurality of data links electrically connected to the plurality of data lines and a plurality of touch lines electrically connected to the plurality of touch electrodes are disposed;

a data driving circuit configured to drive the plurality of data lines; and a touch driving circuit configured to drive the plurality of touch lines, wherein the plurality of data link lines are alternately arranged in two or more layers in a bent area which is an entire non-display area or a portion of the non-display area, and at least one data link line disposed on any one of the two or more layers is made of a same metal as at least one touch line.

Clause 2. The touch display device of clause 1, wherein the plurality of data link lines comprise:

a plurality of first data link lines disposed on any one of the two or more layers; and a second data link line disposed on another one of the two or more layers and made of a same metal as the at least one touch line, and wherein the second data link line is disposed on an upper layer than the first data link lines.

Clause 3. The touch display device of clause 2, wherein the first data link lines and the second data link line are electrically connected to each other via at least one via hole.

Clause 4. The touch display device of clauses 2 or 3, further comprising:

a third data link line provided on an upper layer than the second data link line so as to overlap with the second data link line.

Clause 5. The touch display device of clause 4, wherein the second data link line and the third data link line are electrically connected to each other via at least one via hole.

Clause 6. The touch display device of any preceding clause, wherein the plurality of data link lines are disposed on a same plane in a zigzag pattern in the bent area.

Clause 7. The touch display device of any preceding clause, wherein the bent area is a portion of a substrate of the display panel.

Clause 8. The touch display device of any preceding clause, wherein each of the plurality of touch electrodes is made of an electrode metal patterned in a mesh type.

Clause 9. The touch display device of clause 8, wherein each of the plurality of touch electrodes is provided with a plurality of open areas.

Clause 10. The touch display device of clause 9, wherein each of the plurality of open areas corresponds to a light-emitting area of at least one sub-pixel.

Clause 11. The touch display device of any preceding clause, wherein some of the plurality of touch lines pass through a folded area of the display panel, and the touch lines, which pass through the folded area of the display panel, are alternately arranged in two or more layers.

Clause 12. The touch display device of clause 11, wherein the plurality of touch lines are disposed on a same plane in a zigzag pattern in the folded area.

Clause 13. The touch display device of clause 12, wherein a bent angle of the zigzag pattern is variable to a range where a bent portion of a touch line closest to the display area of the display panel meets the display area of the display panel.

Clause 14. A touch display device comprising:

a display panel having a display area, in which a plurality of touch electrodes are disposed, and a non-display area, which is an outer area of the display area, and, in which a plurality of touch lines electrically connected to the plurality of touch electrodes are disposed; and a touch driving circuit configured to drive the plurality of touch lines, wherein some of the plurality of touch lines pass through a folded area of the display panel, and the touch lines, which pass through the folded area of the display panel, are alternately arranged in two or more layers.

Clause 15. The touch display device of clause 14, wherein the plurality of touch lines are disposed on a same plane in a zigzag pattern in the folded area.

Clause 16. The touch display device of clause 14, wherein a bent angle of the zigzag pattern is variable to a range where a bent portion of a touch line closest to the display area of the display panel meets the display area of the display panel.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate having a display area and a non-display area, the non-display area including a bendable area with a first layer and a second layer on the first layer;
   a plurality of data link lines in the bendable area of the non-display area, and including a first data link line disposed on the first layer;
   a light emitting element over the substrate, the light emitting element including a first electrode, a second electrode over the first electrode, and a light emitting layer between the first electrode and the second electrode;
   an encapsulation layer on the light emitting element;
   a touch buffer layer disposed directly on the encapsulation layer;
   a plurality of touch electrodes on the touch buffer layer;
   a plurality of touch lines in the non-display area and electrically connected to the plurality of touch electrodes; and
   a touch driving circuit configured to drive the plurality of touch lines,
   wherein the first data link line disposed on the first layer is on a different layer from the plurality of touch lines.

2. The display device of claim 1, wherein the non-display area includes a link area adjacent to the bending area,
   wherein the second layer is extended to the link area, and the first layer is located only within the bending area.

3. The display device of claim 2, wherein the plurality of data link lines includes a second data link line disposed on the second layer.

4. The display device of claim 1, wherein the first layer comprises a first organic material, and the second layer comprises a second organic material.

5. The display device of claim 4, wherein the plurality of touch lines includes a first touch line disposed on the second layer and a second touch line disposed on the first touch line.

6. The display device of claim 5, further comprising:
   a touch insulating film interposed between the first touch line and the second touch line.

7. A display device, comprising:
a substrate having a bendable area including a first layer and a second layer on the first layer and a link area adjacent to the bending area, wherein the second layer extends to the link area and the first layer is disposed only within the bending area;
a plurality of data link lines in the bendable area, including a first data link line disposed on the first layer and a second data link line disposed on the second layer;
a light emitting element over the substrate, the light emitting element including a first electrode, a second electrode over the first electrode, and a light emitting layer between the first electrode and the second electrode;
an encapsulation layer on the light emitting element;
a touch buffer layer disposed directly on the encapsulation layer;
a plurality of touch electrodes disposed on the touch buffer layer; and
a plurality of touch lines in the non-display area and electrically connected to the plurality of touch electrodes,
wherein the first data link line disposed on the first layer is on a different layer from the plurality of touch lines.

8. The display device of claim 7 further comprising:
a touch driving circuit configured to drive the plurality of touch lines.

9. The display device of claim 7, wherein the plurality of data link lines includes a second data link line disposed on the second layer.

10. The display device of claim 7, wherein the first layer comprises a first organic material, and the second layer comprises a second organic material.

11. The display device of claim 7, wherein the plurality of touch lines includes a first touch line disposed on the second layer and a second touch line disposed on the first touch line.

12. The display device of claim 11 further comprising:
a touch insulating film interposed between the first touch line and the second touch line.

13. A display device, comprising:
a substrate having a display area and a non-display area, the non-display area including a bendable area having a first layer and a second layer on the first layer;
a plurality of data link lines in the bendable area of the non-display area, and including a first data link line disposed on the first layer;
a plurality of touch electrodes disposed on the substrate;
a plurality of touch lines in the non-display area and electrically connected to the plurality of touch electrodes, including a first touch line disposed on the second layer and a second touch line disposed on the first touch line; and
a touch insulating film interposed between the first touch line and the second touch line,
wherein the first data link line disposed on the first layer is on a different layer from the plurality of touch lines, and
wherein the first data link line and the plurality of touch lines are insulated from each other by the second layer located between the first data link line and the plurality of touch lines, and do not overlap each other in a plan view.

14. The display device of claim 13, wherein the non-display area includes a link area adjacent to the bending area, and wherein the second layer extends to the link area and the first layer is disposed only within the bending area.

15. The display device of claim 13, wherein the plurality of data link lines includes a second data link line disposed on the second layer.

16. The display device of claim 13, wherein the first layer comprises a first organic material and the second layer comprises a second organic material.

17. The display device of claim 13, further comprising:
an encapsulation layer on the substrate; and
a touch buffer layer disposed directly on the encapsulation layer, wherein the plurality of touch electrodes are disposed on the touch buffer layer.

18. The display device of claim 17, further comprising:
a touch driving circuit configured to drive the plurality of touch lines.

* * * * *